May 1, 1962 A. J. WINITZER 3,032,718

D.C. AMPLIFIER

Filed Sept. 15, 1959

INVENTOR.
ALBERT J. WINITZER

BY

KENWAY, JENNEY, WITTER & HILDRETH

ATTORNEYS

United States Patent Office 3,032,718
Patented May 1, 1962

3,032,718
D.C. AMPLIFIER

Albert J. Winitzer, Sharon, Mass., assignor, by mesne assignments, to Northrop Corporation, Beverly Hills, Calif., a corporation of California Filed Sept. 15, 1959, Ser. No. 840,117
2 Claims. (Cl. 330—14)

This invention relates in general to a new and improved D.C. amplifier, in particular to a D.C. transistor amplifier which provides a pair of D.C. output signals related to the amplitude and the polarity of a single D.C. input signal.

Presently available servo systems are frequently incapable of meeting the accuracy requirements of some of the more specialized servo applications. This is particularly the case in servo loops which include a heavy duty torquer motor where difficulty is often encountered in the vicinity of the null point in obtaining positive motor control. As a result, the torquer motor cannot be positioned accurately in accordance with its input signal and the performance of the servo loop suffers.

The invention which forms the subject matter of this application overcomes the foregoing disadvantages by providing a D.C. amplifier in the servo loop which has a single-ended input and a double-ended output. The load, e.g. the torquer motor preceded by a power amplifier, is connected across both output terminals. A negative D.C. input signal produces an amplified output signal of the same polarity at the first output terminal, while the amplitude of the signal appearing on the second output terminal is negligible. For a positive D.C. input signal the situation is reversed. In this case, the second terminal now provides an amplified output signal whose polarity is opposite to that of the input signal. The output signal appearing on the first output terminal, however, is negligible. Since the load is connected across both output terminals, a more positive control is achieved than would be possible in a conventional D.C. amplifier. Additionally, the D.C. amplifier which forms the subject matter of this application, is relatively drift-free because of its balanced circuitry and thereby overcomes one of the major disadvantages of conventional D.C. amplifiers. The use of transistors in the amplifier provides a relatively simple circuit and contributes to the compactness of the amplifier while improving its reliability.

It is, accordingly, the primary object of this invention to provide a D.C. amplifier which overcomes the disadvantages associated with presently available D.C. amplifiers and which, when used in a servo loop, is capable of providing positive servo control throughout the entire operating range of the amplifier.

Figure 1:
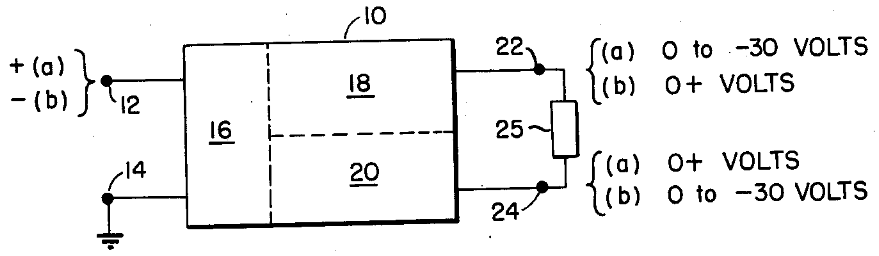
Figure 2:
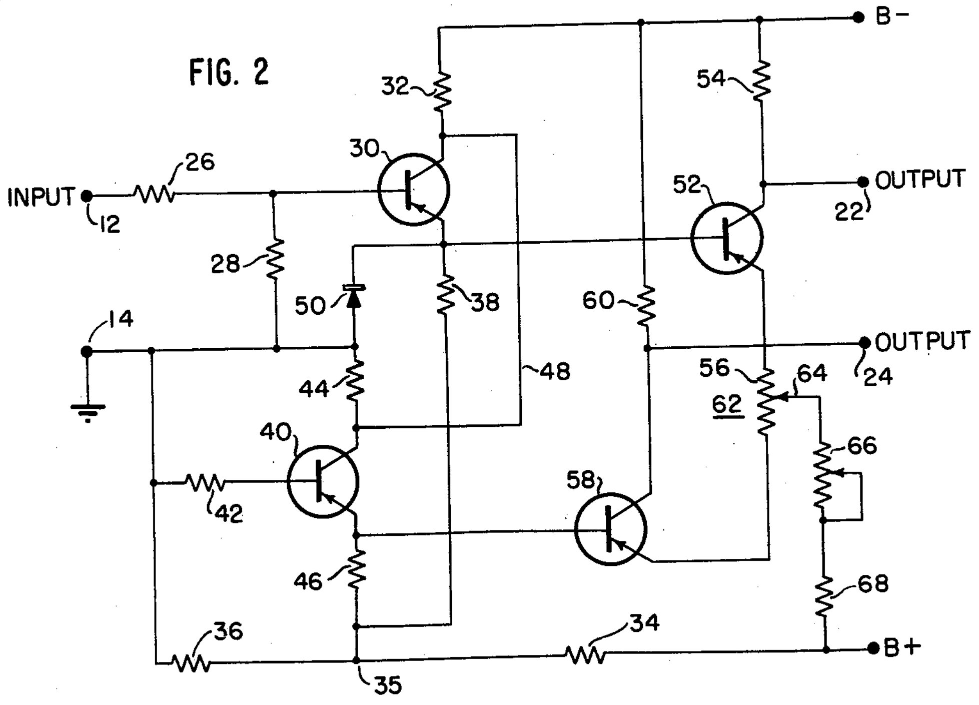

This and other objects of the invention, together with further features and advantages thereof, will become apparent from the following detailed specification when read with the accompanying drawings, in which:

FIG. 1 is a functional representation of the D.C. amplifier which forms the invention herein; and FIG. 2 illustrates a preferred embodiment of the invention.

With reference now to FIG. 1, the amplifier 10 of the invention and its operation are functionally represented. The single-ended input of the amplifier consists of a pair of terminals 12 and 14. Terminal 14 is tied to a reference point, e.g. to ground. The amplifier 10 consists of an input section 16 and a pair of output channels 18 and 20. The respective output signals which are derived from the output channels appear on the output terminals 22 and 24 respectively, the load 25 being connected between the latter. An input signal which is positive with respect to ground when applied to the input terminal 12, is represented in FIG. 1 by condition (*a*), while an input signal which is negative with respect to ground is denoted by condition (*b*). The construction of the amplifier is such that the application of a positive input signal according to condition (*a*) results in an amplified negative output signal at the terminal 22. It will be noted, that the linear range of amplification extends from zero to −30 volts. Condition (*a*) further results in the appearance of a positive output signal on the output terminal 24 which is either zero, or which has negligible amplitude. This is indicated in FIG. 1 as 0+ volts. The reverse situation obtains when a negative input signal is applied to the input terminal 12, i.e. condition (*b*). In this case, the positive output signal on the output terminal 22 is 0+ volts, i.e. it is either zero or it has negligible amplitude. The output signal appearing on the output terminal 24, however, corresponds to an amplified input signal of the same (negative) polarity. As before, the linear amplification range extends from zero to −30 volts.

FIG. 2 illustrates a preferred embodiment of the invention, applicable reference numerals having been carried forward from FIG. 1 wherever possible. The input signal is applied between the input terminals 12 and 14, the latter of which is grounded to form a single-ended input. The input circuit includes a first voltage divider which consists of a resistor 26 connected in series with the input terminal 12 and a resistor 28 connected between the other terminal of the resistor 26 and ground. The transistor 30 which is connected as an emitter follower, receives the input signal at its base which is connected to the junction point of the resistors 26 and 28. A coupling resistor 32 connects the collector of the transistor 30 to a power supply B− which supplies a D.C. voltage of −30 volts. A second voltage divider consists of a pair of resistors 34 and 36 respectively, which are connected between a second D.C. power supply B+ and ground. The B+ power supply provides D.C. voltage of +30 volts. An emitter resistor 38 is connected between the emitter of the transistor 30 and the junction point 35 of the resistors 34 and 36. Accordingly, the energization voltage applied across the emitter-collector junction of the transistor 30 is determined by both the B+ and the B− power supplies.

Another transistor 40 is also connected as an emitter follower, its base and collector being coupled to ground by means of resistors 42 and 44 respectively. An emitter resistor 46 is connected between the emitter of the transistor 40 and the aforesaid junction point 35. A connection 48 between the collectors of the transistors 30 and 40, permits the energization of the transistor 40 from the B− source through the resistor 32. Accordingly, the transistor 40 is energized in the same manner as transistor 30 from both power supplies. A current limiting diode 50 is connected between the emitter of transistor 30 and ground and is poled to conduct when the negative potential of the emitter exceeds a predetermined value.

An output transistor 52, which is connected to operate as an amplifier, has its base connected to the emitter of the transistor 30. The collector of the transistor 52 is coupled to the B− source by means of a resistor 54. The aforesaid output terminal 22 is connected to the collector of the transistor 52. A second output transistor 58, which is similarly connected as an amplifier, has its base connected to the emitter of the transistor 40, while its collector is coupled to the B— source by means of a resistor 60. The aforesaid output terminal 24 is connected to the collector of the transistor 58. A common balancing resistor 56 is connected between the emitters of transistors 52 and 58 and comprises the resistive slide wire of a balancing potentiometer 62 whose slider 64 is connected to an adjustable resistor 66. The latter preferably consists of a potentiometer whose slide wire winding is connected to the slider itself. The adjusting resistor 66 is connected in series with a fixed resistor 68 which, in turn, is connected to the B+ power supply.

Prior to the operation of the circuit of FIG. 2, a short circuit is placed across the input terminals 12 and 14. The potentiometer 62 is adjusted in order to obtain balance at the respective output terminals 22 and 24. Thereafter, the resistor 66 is varied in order to obtain zero output signals at both output terminals. If, according to condition (*a*), a positive input signal is applied to the input terminal 12, it is coupled to the base of the transistor 30 and tends to decrease the current flow across its emitter-collector junction. Since this transistor is connected as an emitter follower, a positive signal will appear at the emitter which is coupled to the base of the output transistor 52. The application of the positive signal to the base of the output transistor 52 drives this transistor toward cut-off so that the current flow across its emitter-collector junction decreases. This action causes the voltage drop across the load resistor 54 to decrease with the result that the voltage on the collector of the transistor 52 approaches the voltage of the B— source, i.e. it decreases. The lower limit of the voltage on the collector is determined by the D.C. voltage of the B— source which, in a preferred embodiment is chosen to be —30 volts. Depending on the amplitude of the positive input signal, which is applied to the input terminal 12 of the amplifier, and on the amplification factor of the transistor 52, the amplitude of the D.C. output signal which is derived at the output terminal 22 will vary linearly between 0 and —30 volts.

The application of the positive input signal which drives the transistor 30 toward cut-off and thus provides the linearly amplified D.C. output signal at the output terminal 22 also fixes the voltage at the output terminal 24. This action is initiated by the decreased current flow through the adjustable resistor 66 and the fixed resistor 68 which occurs as collector current through the transistor 52 decreases. The resistors 66 and 68 are common emitter resistors for both transistors 52 and 58. As current through these resistors decreases, the voltage drop across them also decreases, causing a more positive voltage to appear at the emitter of the transistor 58. This positive voltage at the emitter of the transistor 58 has the same effect that a negative voltage on its base would have. The transistor 58 is driven to saturation, and the output terminal 24, being connected to the collector of the transistor 58, becomes slightly positive, but remains substantially at zero potential.

The application of a negative input signal to the input terminal 12 according to condition (*b*) produces a negative signal at the emitter of the transistor 30. This negative signal is applied to the base of the transistor 52 and serves to drive the latter to saturation. As a result of the circuit balancing operation explained above, the signal appearing at the collector of transistor 52, and hence on the output terminal 22, is substantially zero. Actually, as explained in connection with the circuit operation for condition (*a*), a D.C. output signal appears on the output terminal 22 which is positive and has negligible amplitude. The increased current flow across the emitter-collector junction of the transistor 52 brings about a greater voltage drop in the common resistors 66 and 68 and has a tendency to lower the voltage applied to the emitter of the transistor 58. As the voltage on the emitter of the transistor 58 decreases, less and less current is passed, and the transistor 58 heads toward cut-off. The output terminal 24, being connected to the collector of the transistor 58, becomes increasingly negative, approaching the —30 value of the B— supply if the transistor 58 goes to complete cut-off. Actually, the output signal which appears on the output terminal 24 varies linearly between 0 and —30 volts depending on the amplitude of the input signal and on the amplification factor of the transistor 58. It will be noted, however in contradistinction to condition (*b*), that a negative input signal results in an amplified output signal of the same polarity.

If the amplitude of the negative voltage which appears at the emitter of the transistor 30 is very large, the possibility of over-driving the transistor 52 exists. In this case, output terminal 22 may have a negative voltage on it at the same time as output terminal 24. In order to prevent such an operation, the diode 50 is connected between the base of the transistor 52 and ground. If the negative voltage on the emitter exceeds a predetermined value, the diode 50 becomes conductive and shunts the base to ground. In the latter case, no further voltage decrease is possible.

The transistor 40 functions only as a stabilizer or battery for the base of the transistor 58. With the various changes occurring at the emitter of the transistor 58, it is desirable to hold the base at a constant reference potential to preserve the original balance and zero output obtained by short-circuiting the input terminals and adjusting the potentiometer 56 and the variable resistor 66.

Although a preferred embodiment of the invention has been described, the invention is not confined to the precise circuit which is illustrated. For example, either npn or pnp transistors may be used, provided the proper polarities are observed. Similarly, the resistive coupling connections need not take the form illustrated in the drawings, provided only that the overall circuit relationship remains unchanged. The D.C. power supplies are not, of course, confined to the 30 volt supplies disclosed herein, but may provide properly poled D.C. voltages of any desired amplitude consistent with the circuit requirements.

From the foregoing disclosure it will be apparent that numerous modifications, departures and equivalents will now occur to those skilled in the art, all of which fall within the true spirit and scope of this invention.

I claim:

1. A D.C. amplifier comprising a pair of input terminals, one of said input terminals being connected to ground, a pair of power supplies adapted to provide positive and negative D.C. voltages, a first voltage divider connected between the other one of said input terminals and ground, first and second transistors each connected as an emitter follower, the collectors of said transistors being connected together and being resistively coupled to said negative power supply, a second voltage divider connected between said positive power supply and ground and including a common junction point, a pair of resistors connected respectively between the emitters of said first and second transistors and said common junction point, the base of said first transistor being coupled to said first voltage divider, the base and collector of said second transistor being resistively coupled to ground, first and second output transistors each having a collector resistively coupled to said negative D.C. power supply, the bases of said first and second output transistors being connected to the emitters of said first and second transistors respectively, a balancing potentiometer having a slider and a resistive winding connected between the emitters of said first and second output transistors, a pair of resistors connected in series between the slider of said balancing potentiometer and said positive D.C. power supply, one of said last recited resistors being adjustable, and a pair of output terminals connected to the collectors of said first and second output transistors respectively.

2. The apparatus of claim 1 and further comprising a diode connected between the emitter of said first transistor and ground, said diode being poled to conduct when the voltage on said last recited emitter falls below a predetermined level.

References Cited in the file of this patent

UNITED STATES PATENTS 2,761,917 Aronson ---------------- Sept. 4, 1956

OTHER REFERENCES

Shea Text, "Principles of Transistor Circuits," 1953, p. 30.

Slaughter: "Feedback-Stabilized Transistor Amplifier," Electronics, May 1955, pp. 174–175.

Slaughter: "The Emitter-Coupled Differential Amplifier," IRE Transactions-Circuit Theory, March 1956, pages 51–53.